(12) United States Patent
Wei

(10) Patent No.: US 12,170,115 B2
(45) Date of Patent: Dec. 17, 2024

(54) WRITE PERFORMANCE OPTIMIZATION FOR ERASE ON DEMAND

(71) Applicant: Micron Technology, Inc., Boise, ID (US)

(72) Inventor: Meng Wei, Shanghai (CN)

(73) Assignee: MICRON TECHNOLOGY, INC., Boise, ID (US)

( * ) Notice: Subject to any disclaimer, the term of this patent is extended or adjusted under 35 U.S.C. 154(b) by 263 days.

(21) Appl. No.: 17/451,479

(22) Filed: Oct. 19, 2021

(65) Prior Publication Data
US 2023/0062995 A1 Mar. 2, 2023

(30) Foreign Application Priority Data
Aug. 30, 2021 (WO) ................ PCT/CN2021/115333

(51) Int. Cl.
*G11C 16/14* (2006.01)
*G06F 12/02* (2006.01)
*G11C 16/16* (2006.01)
*G11C 16/32* (2006.01)

(52) U.S. Cl.
CPC .......... *G11C 16/14* (2013.01); *G06F 12/0253* (2013.01); *G11C 16/16* (2013.01); *G11C 16/32* (2013.01)

(58) Field of Classification Search
CPC ......... G11C 16/14; G11C 16/16; G11C 16/32; G06F 12/0253
USPC .................................................. 365/185.33
See application file for complete search history.

(56) References Cited

U.S. PATENT DOCUMENTS

| | | | | |
|---|---|---|---|---|
| 11,429,307 | B2* | 8/2022 | Choi | G06F 3/0652 |
| 2011/0238507 | A1* | 9/2011 | Ben-Rubi | G06Q 30/0277 |
| | | | | 705/14.73 |
| 2016/0117105 | A1* | 4/2016 | Thangaraj | G06F 3/0604 |
| | | | | 711/103 |
| 2016/0179386 | A1 | 6/2016 | Zhang | |
| 2017/0154681 | A1 | 6/2017 | Zhou | |
| 2017/0286288 | A1* | 10/2017 | Higgins | G06F 12/0246 |
| 2018/0307598 | A1 | 10/2018 | Fischer et al. | |

FOREIGN PATENT DOCUMENTS

| | | |
|---|---|---|
| CN | 106816175 A | 6/2017 |
| CN | 111708713 A | 9/2020 |

OTHER PUBLICATIONS

International Search Report and Written Opinion, PCT App. No. PCT/CN2021/115333, May 26, 2022, 9 pages.

* cited by examiner

*Primary Examiner* — Connie C Yoha
(74) *Attorney, Agent, or Firm* — NICHOLSON DE VOS WEBSTER & ELLIOTT LLP

(57) ABSTRACT

Exemplary methods, apparatuses, and systems include erasing a portion of memory from a garbage pool in response to detecting an idle period. A request to write data to the memory is received and it is determined that a charge gain threshold has not been satisfied for the erased portion of memory. The data is written to the erased portion of memory in response to determining the charge gain threshold has not been satisfied.

20 Claims, 4 Drawing Sheets

WRITE PERFORMANCE OPTIMIZATION FOR ERASE ON DEMAND

CROSS-REFERENCE TO RELATED APPLICATION

The present application claims the benefit of International Application No. PCT/CN2021/115333 filed on Aug. 30, 2021, which is hereby incorporated by reference.

TECHNICAL FIELD

The present disclosure generally relates to erasing portions of memory devices for the programming of data, and more specifically, relates to optimizing an erase on demand scheme to provide and maintain a limited amount of erased memory in anticipation of requests to program data.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
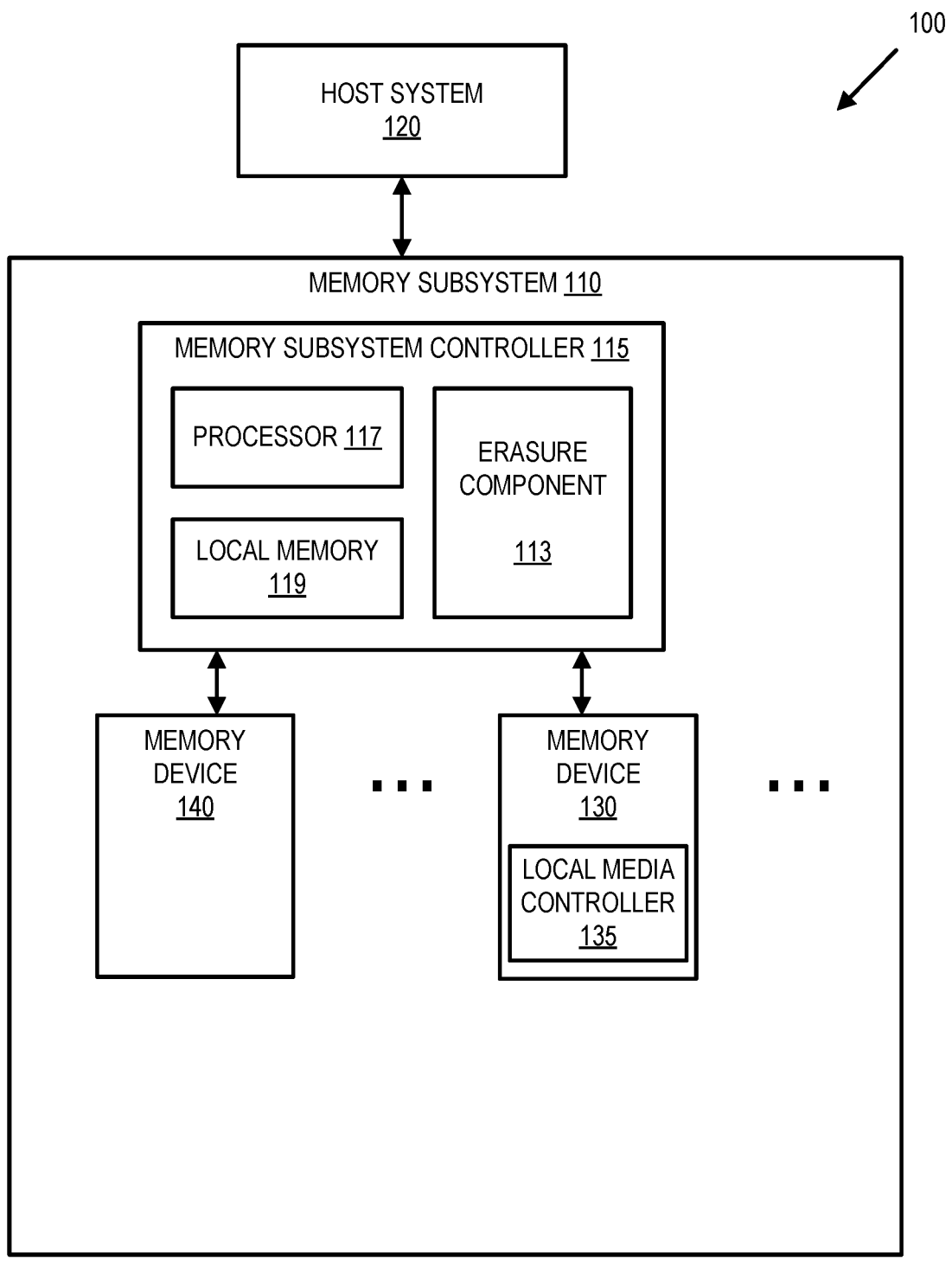
FIG. 1 illustrates an example computing system that includes a memory subsystem in accordance with some embodiments of the present disclosure.

Aspects of the present disclosure are directed to optimizing an erasure on demand scheme to provide a limited amount of erased memory in anticipation of requests to program data in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

The logic states in memory cells are differentiated using charge distribution levels. For example, an MLC can be capable of storing four different charge levels, L0, L1, L2, and L3, to represent four different binary values, 11, 10, 01, and 00. The data charge level becomes a threshold voltage, such that, when a read reference voltage is applied to a transistor for the memory cell, the transistor will turn on when the read reference voltage is higher than the threshold voltage. Charge gain, also referred to as charge distribution growth and charge migration, is a change in the threshold voltage that can result in a loss in reliability of the state of memory cells. In particular, L0 charge gain for a memory cell in an erased state (e.g., an MLC with a threshold voltage corresponding to storing a binary value of "11") due to electron injection or hole de-trapping in/from the storage nitride layer can lead to the memory cell appearing to be in a non-erased state (e.g., a threshold voltage corresponding to storing a binary value of "10").

Advancements in memory cell design, e.g., from floating-gate architecture to replacement-gate architecture, yield improvements, such as improved storage density, write endurance, and latency. These advancements have also brought about a greater sensitivity to charge gain. For example, the onset of L0 charge gain can start seconds after erasing a replacement-gate memory cell as comparted to a few hours in a floating-gate memory cell. An erased block of memory can become unreliable if not programmed within, e.g., an hour of erasure. This greater sensitivity to charge gain has led to the avoidance of the pre-erasure of memory blocks. Erase on demand (EOD) is one technique used to address faster charge gain. This scheme will not erase a block until the memory subsystem receives a request to program data to the block. As a result, the time gap between erasure and programming of this block will be small and the block won't suffer from unreliability due to L0 charge gain. EOD, however, has a disadvantage in terms of system performance because each block's programming time will include the erase time. For example, in an exemplary memory architecture, nearly ten percent of the time it takes to program a page of memory can be attributed to block erase time. This extra time impacts sequential write throughput. For large density drives, in which the memory subsystem is unable to erase all the blocks across each LUN in parallel due to peak power constraints, the impact of the additional erase time is even greater.

Aspects of the present disclosure address the above and other deficiencies by providing a limited amount of erased memory in anticipation of requests to program data in a memory subsystem. For example, the memory subsystem can use idle periods to erase one block stripe ahead of host requests to program data. Additionally, the memory subsystem can maintain the limited pool of erased blocks by tracking a charge gain threshold (e.g., an amount of time since erasure) and moving the blocks back to a garbage pool when the charge gain threshold is satisfied. When the memory subsystem is unable to fulfill a program request with the pool of erased blocks, the memory subsystem can revert to EOD and use the next idle period to erase another block stripe prior to the next program request. As a result of maintaining a limited pool of erased blocks, the memory subsystem has an improved sequential write throughput (e.g., in terms of burst performance) without consuming resources to erase excess of blocks that are likely to suffer from charge gain.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM)

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes an erasure component 113 that can optimize an erasure on demand scheme by providing a limited amount of erased memory in anticipation of requests to program data. In some embodiments, the controller 115 includes at least a portion of the erasure component 113. For example, the controller 115 can include a processor 117 (processing device) configured to execute instructions stored in local memory 119 for performing the operations described herein. In some embodiments, an erasure component 113 is part of the host system 120, an application, or an operating system.

The erasure component 113 can provide a limited amount of erased memory in anticipation of requests to program data in a memory subsystem. For example, the memory subsystem can use idle periods to erase one or more blocks ahead of host requests to program data. Additionally, the memory subsystem can maintain the limited pool of erased blocks by tracking a charge gain threshold and moving the blocks back to a garbage pool when the charge gain threshold is satisfied. Further details with regards to the operations of the erasure component 113 are described below.

Figure 2:
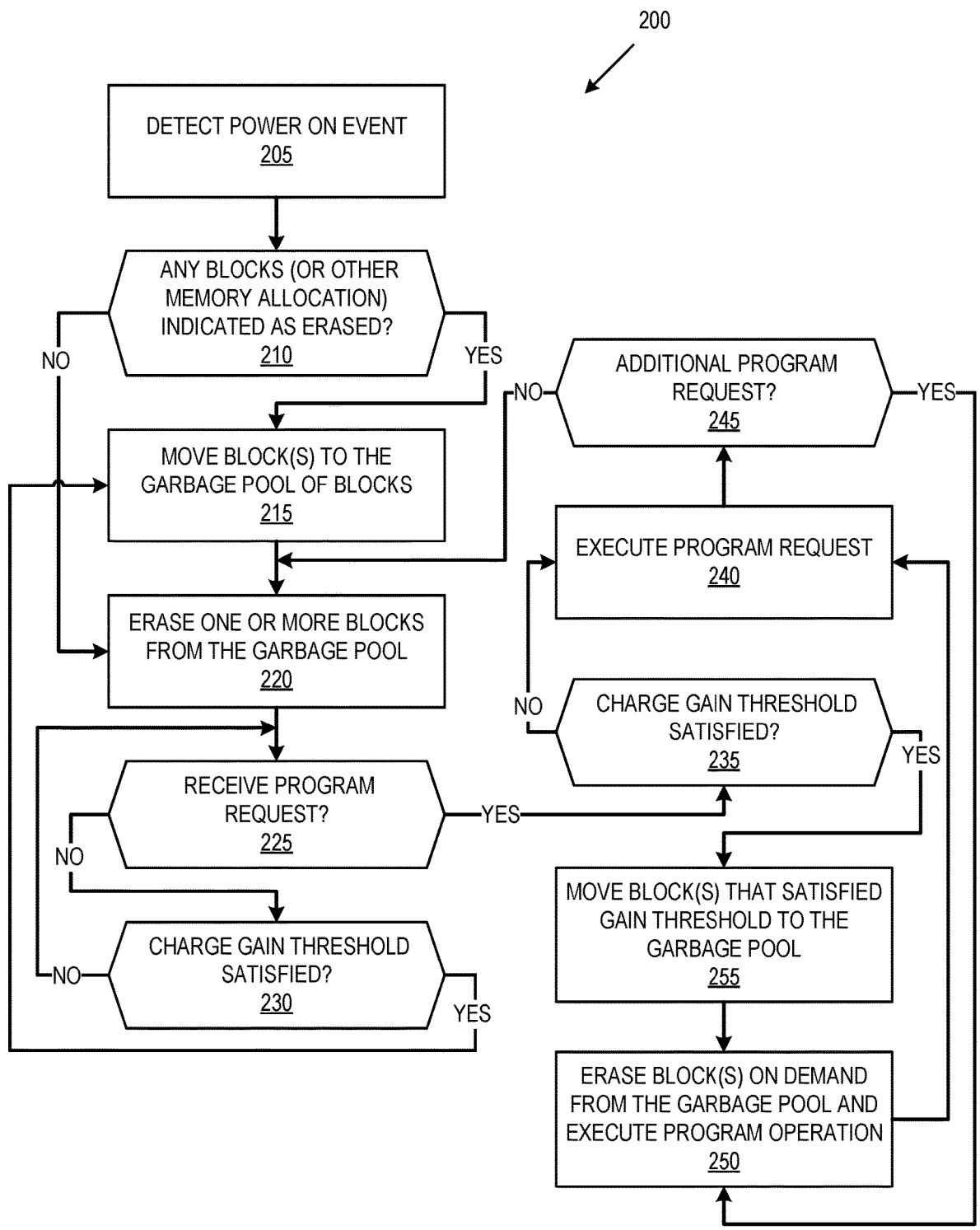
FIG. 2 is a flow diagram of an example method to optimize an erase on demand scheme by providing a limited amount of erased memory in anticipation of requests to program data in accordance with some embodiments of the present disclosure.

FIG. 2 is a flow diagram of an example method 200 to optimize an erase on demand scheme by providing a limited amount of erased memory in anticipation of requests to program data in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the erasure component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the processing device detects a power on event. For example, the processing device determines when the memory subsystem is in the process of or has completed a reboot, restart, or other power on process.

At operation 210, the processing device determines if one or more portions of memory are in an erasure pool, flagged as erased, or otherwise indicated to have been previously erased. For example, the processing device can maintain a list of blocks that were erased prior to the power on event. If the processing device determines that one or more portions of memory have been previously erased, the method 200 proceeds to operation 215. If the processing device determines that no portions of memory have been previously erased, the method 200 proceeds to operation 220.

At operation 215, the processing device moves the one or more portions of memory determined to have been previously erased to a garbage pool. For example, the processing device can maintain a list or other data structure identifying blocks of memory that are to be erased prior to being programmed with valid data.

At operation 220, the processing device erases one or more portions of memory from the garbage pool in response to detecting an idle period. For example, the processing device can select one or more blocks from the garbage pool data structure, erase those blocks, and mark them as erased. In one embodiment, the processing device moves the identification of the erased blocks from the garbage pool to an erasure pool to indicate that the blocks are ready to be programmed. In one embodiment, the amount of memory selected from the garbage pool is dynamically based on host write patterns. For example, the processing device can receive or track data indicating the frequency of host writes and determine and update a number of blocks to match the estimated consumption of memory by the host writes. Using this indication of host write frequency, the processing device erases the matching number of blocks (or other portions of memory). In another embodiment, the amount of memory selected from the garbage pool is a static value set at the time of manufacture, selected by a user/administrator of the host device, etc.

Additionally, the processing device can start a timer, store a time of erasure along with the identification of the erased blocks, or otherwise track an amount of time that passes following the erasure. In one embodiment, detecting the idle period includes detecting a power on event as described with reference to operation 205. In another embodiment, detecting the idle period includes determining there are no new write requests, as describe below with reference to operation 245.

At operation 225, the processing device determines if a programming request has been received. For example, the processing device detects if any programming/write requests have been received by the memory subsystem from a host system. If a programming request has not been received, the method 200 proceeds to operation 230. If a programming request has been received, the method 200 proceeds to operation 235.

At operation 230, the processing device determines if a charge gain threshold has been satisfied. For example, the processing device can determine if a threshold amount of time has passed since erasure of the one or more blocks in the erasure pool, which would indicate that the one or more blocks may no longer be reliably in an erased state. This determination can include checking a current value of a timer, comparing a stored value of the erasure time to a current time, etc. As another example, the processing device can use another indicator of charge gain threshold. For example, the processing device can test L0 values with a read operation. A portion of memory with distribution of threshold voltages that has shifted by or beyond a threshold amount of voltage can be deemed to have satisfied the charge gain threshold.

In one embodiment, the charge gain threshold is a static value. For example, the charge gain threshold can be set based upon a worst-case scenario for the memory subsystem, such as end-of-life performance. In another embodiment, the charge gain threshold is a dynamic value. For example, the processing device can update the charge gain threshold over different stages of life of the memory subsystem, such as beginning-of-life, middle-of-life, and end-of-life. The processing device can determine different stages of life based on, e.g., one or more of: the number of program/erase cycles performed by the memory subsystem, time the memory subsystem has been in use, cross temperature stress, etc. In an embodiment with a dynamic charge gain threshold, the processing device can take advantage of charge gain occurring slower at the beginning-of-life than at the end-of-life of the memory subsystem.

If the charge gain threshold has been satisfied, the method 200 returns to operation 215 to refresh the erasure pool. If the charge gain threshold has not been satisfied, the method 200 returns to operation 225 to continue monitoring for a programming request.

At operation 235, the processing device determines if the charge gain threshold has been satisfied. In response to the programming request, similar to operation 230, the processing device can determine if a threshold amount of time has passed since erasure of the one or more blocks in the erasure pool. If the charge gain threshold has not been satisfied, the method 200 proceeds to operation 240. If the charge gain threshold has been satisfied, the method 200 proceeds to operation 255.

At operation 240, the processing device executes the programming request using the erasure pool. For example, the processing device can write host data to one or more portions of memory erased at operation 220 in response to determining the charge gain threshold has not been satisfied. As a result, the processing device fulfills the programming request faster than when using a simple erase on demand technique.

At operation 245, the processing device determines if another programming request has been received. For example, the memory subsystem can receive one or more requests from a host system to write data in an amount that exceeds the one or more portions of memory in the erasure pool. Additionally, the memory subsystem can receive multiple requests from a host system to write data without an intervening idle period between first and subsequent requests. If another programming request has been received, the method 200 proceeds to operation 250. If another programming request has not been received, the method 200 returns to operation 220 to replenish the erasure pool while idle.

At operation 250, the processing device erases one or more portions of memory on demand. For example, the processing device can select one or more blocks from the garbage pool and erase them in performance of fulfilling the additional request to write data, in accordance with an erase on demand scheme. The method 200 can return to operation 240 to perform the programming of data to the one or more portions of memory that were erased on demand.

At operation 255, the processing device moves the one or more portions of memory determined to have been previously erased to a garbage pool. For example, in response to determining the charge gain threshold has been satisfied when a program request has been received, the processing device can move the identification of erased blocks from the erasure pool to the garbage pool as described above with reference to operation 215. The method 200 can proceed to operation 250 to erase one or more portions of memory on demand to fulfill the program request, as described above.

Figure 3:
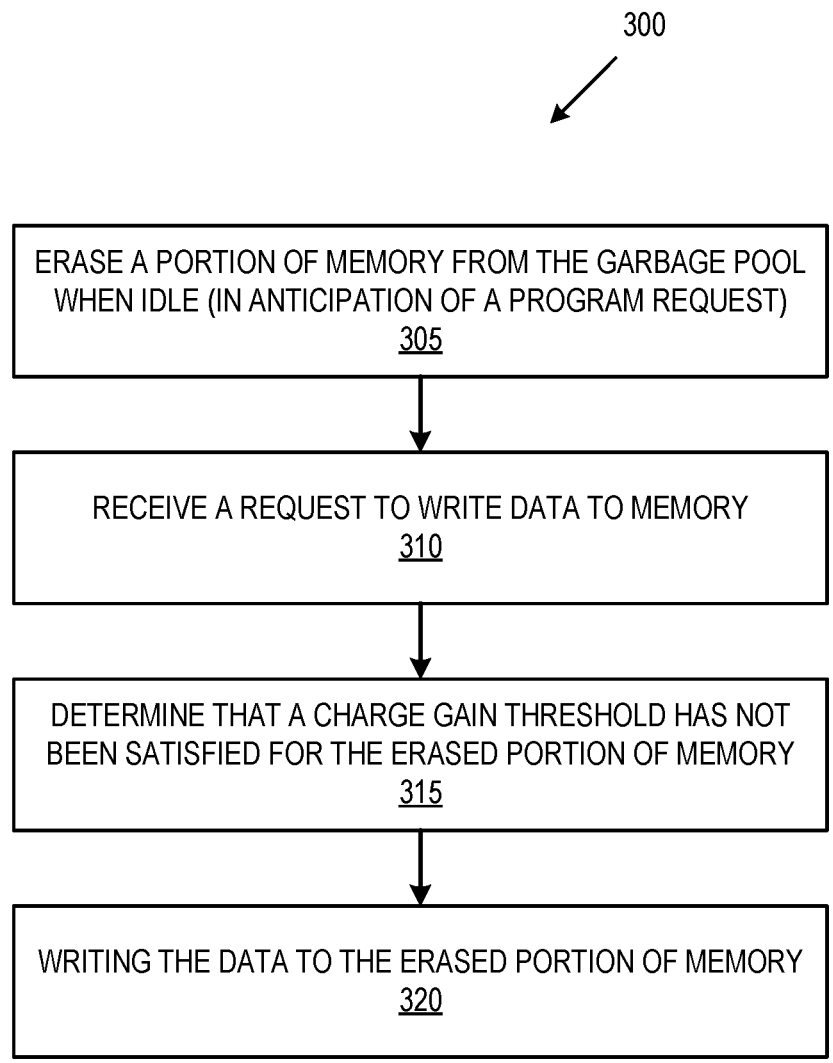
FIG. 3 is a flow diagram of an example method to optimize an erase on demand scheme by providing a limited amount of erased memory in anticipation of requests to program data in accordance with some embodiments of the present disclosure.

FIG. 3 is a flow diagram of an example method 300 to optimize an erase on demand scheme by providing a limited amount of erased memory in anticipation of requests to program data in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the erasure component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device erases a portion of memory from the garbage pool while the memory subsystem is idle. For example, the processing device can erase a limited portion of memory in anticipation of a future request to write data as described above with reference to operation 220.

At operation 310, the processing device receives a request to write data to memory. For example, the processing device detects if any write requests have been received by the memory subsystem from a host system as described above with reference to operation 225.

At operation 315, the processing device determines that a charge gain threshold has not been satisfied for the erased portion of memory. For example, the processing device can determine that a threshold amount of time has not passed since erasure of the one or more blocks in the erasure pool in response to the programming request, as described above with reference to operation 235.

At operation 320, the processing device writes the data of the write request to the erased portion of memory. For example, the processing device can write host data to one or more portions of memory erased at operation 305 in response to determining the charge gain threshold has not been satisfied at operation 315. As a result, the processing device fulfills the programming request faster than when using a simple erase on demand technique.

Figure 4:
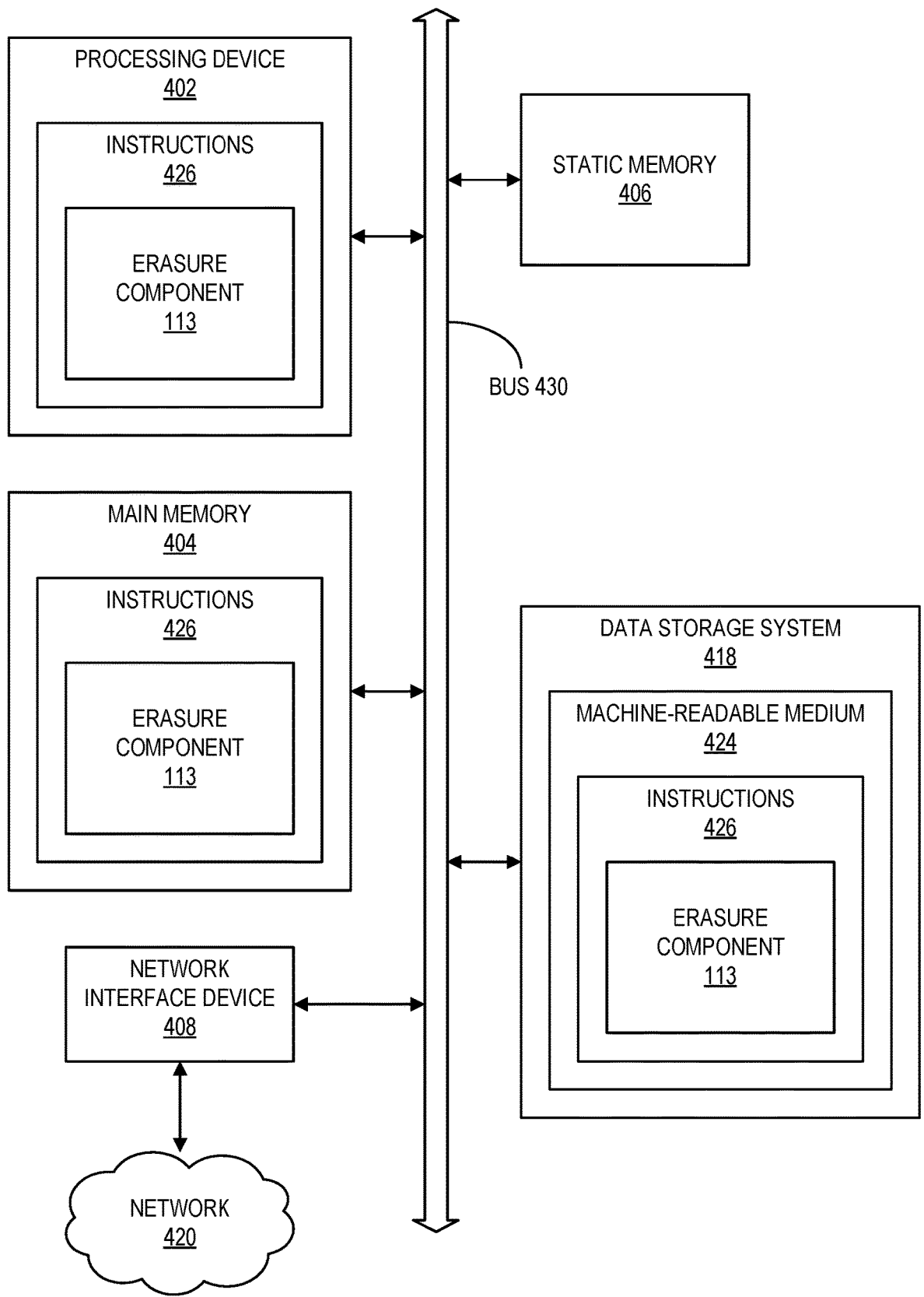
FIG. 4 is a block diagram of an example computer system in which embodiments of the present disclosure may operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the erasure component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory subsystem 110 of FIG. 1.

In one embodiment, the instructions 426 include instructions to implement functionality corresponding to an erasure component (e.g., the erasure component 113 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 200 and 300 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   erasing a portion of memory from a garbage pool in response to detecting an idle period;
   receiving a request to write data to the memory;
   determining that a charge gain threshold has not been satisfied for the erased portion of memory; and
   writing the data to the erased portion of memory in response to determining the charge gain threshold has not been satisfied.

2. The method of claim 1, wherein the charge gain threshold is a threshold amount of time following the erasing of the portion of memory.

3. The method of claim 1, wherein detecting the idle period includes detecting a power on event.

4. The method of claim 3, further comprising:
   moving a second portion of memory to a garbage pool to be erased in response to determining the second portion of memory was erased prior to the power on event.

5. The method of claim 1, wherein detecting the idle period includes determining there are no new write requests.

6. The method of claim 1, further comprising:
   determining that a charge gain threshold has been satisfied for a second erased portion of memory;
   moving the second erased portion of memory to a garbage pool in response to determining the charge gain threshold has been satisfied; and
   erasing a third portion of memory from the garbage pool in response to detecting an idle period.

7. The method of claim 1, further comprising:
   receiving a second request to write data to the memory prior to a subsequent idle period; and
   erasing a second portion of memory on demand in performance of fulfilling the second request to write data.

8. A non-transitory computer-readable storage medium comprising instructions that, when executed by a processing device, cause the processing device to:
   erase a portion of memory from a garbage pool in response to detecting an idle period;
   receive a request to write data to the memory;
   determine that a charge gain threshold has not been satisfied for the erased portion of memory; and
   write the data to the erased portion of memory in response to determining the charge gain threshold has not been satisfied.

9. The non-transitory computer-readable storage medium of claim 8, wherein the charge gain threshold is a threshold amount of time following the erasing of the portion of memory.

10. The non-transitory computer-readable storage medium of claim 8, wherein detecting the idle period includes detecting a power on event.

11. The non-transitory computer-readable storage medium of claim 10, wherein the processing device is further to:
    move a second portion of memory to a garbage pool to be erased in response to determining the second portion of memory was erased prior to the power on event.

12. The non-transitory computer-readable storage medium of claim 8, wherein detecting the idle period includes determining there are no new write requests.

13. The non-transitory computer-readable storage medium of claim 8, wherein the processing device is further to:
    determine that a charge gain threshold has been satisfied for a second erased portion of memory;
    move the second erased portion of memory to a garbage pool in response to determining the charge gain threshold has been satisfied; and
    erase a third portion of memory from the garbage pool in response to detecting an idle period.

14. The non-transitory computer-readable storage medium of claim 8, wherein the processing device is further to:
    receive a second request to write data to the memory prior to a subsequent idle period; and erase a second portion of memory on demand in performance of fulfilling the second request to write data.

15. A system comprising:
a memory device; and
a processing device, operatively coupled with the memory device, to:
    erase a portion of memory from a garbage pool in response to detecting an idle period;
    receive a request to write data to the memory;
    determine that a charge gain threshold has not been satisfied for the erased portion of memory, wherein the charge gain threshold is a threshold amount of time following the erasing of the portion of memory; and
    write the data to the erased portion of memory in response to determining the charge gain threshold has not been satisfied.

16. The system of claim 15, wherein detecting the idle period includes detecting a power on event.

17. The system of claim 16, wherein the processing device is further to:
    move a second portion of memory to a garbage pool to be erased in response to determining the second portion of memory was erased prior to the power on event.

18. The system of claim 15, wherein detecting the idle period includes determining there are no new write requests.

19. The system of claim 15, wherein the processing device is further to:
    determine that a charge gain threshold has been satisfied for a second erased portion of memory;
    move the second erased portion of memory to a garbage pool in response to determining the charge gain threshold has been satisfied; and
    erase a third portion of memory from the garbage pool in response to detecting an idle period.

20. The system of claim 15, wherein the processing device is further to:
    receive a second request to write data to the memory prior to a subsequent idle period; and
    erase a second portion of memory on demand in performance of fulfilling the second request to write data.

* * * * *